United States Patent [19]
Ohishi et al.

[11] Patent Number: 5,034,942
[45] Date of Patent: Jul. 23, 1991

[54] SYSTEM HAVING A FUNCTION OF REPRODUCING OPTICAL INFORMATION

[75] Inventors: Akio Ohishi, Tokyo; Masayuki Inoue, Yokohama, both of Japan

[73] Assignee: Hitachi, Ltd., Tokyo, Japan

[21] Appl. No.: 224,987

[22] Filed: Jul. 27, 1988

[30] Foreign Application Priority Data

Jul. 29, 1987 [JP] Japan .................. 62-187518

[51] Int. Cl.$^5$ .................. G11B 7/125; G11B 7/00
[52] U.S. Cl. .................. 369/122; 369/121; 369/116
[58] Field of Search .................. 369/122

[56] References Cited

FOREIGN PATENT DOCUMENTS 59-210541 11/1984 Japan .
60-101735 6/1985 Japan .

OTHER PUBLICATIONS

English Translation of JP 60-101735.
English Translation of JP 59-210541.

Primary Examiner—Roy N. Envall, Jr.
Assistant Examiner—Thang V. Tran
Attorney, Agent, or Firm—Antonelli, Terry, Stout & Kraus

[57] ABSTRACT

An optical information recording-reproducing system is provided using a laser diode with independent pulsating emission for recording and/or reproducing information, with the laser pulse period T (sec) and the distance L (m) between the semiconductor laser and information recording medium being set to meet the inequality:

$$(n-1) \times 0.8 \times c/2L < i/T < n \times 0.7 \times c/2L$$

where c is the velocity of light, and n is a natural number. By virtue of this arrangement, the relative noise intensity inherent to the optical feedback from the information recording medium is reduced below $10^{-3} \text{Hz}^{-1}$.

1 Claim, 4 Drawing Sheets

SYSTEM HAVING A FUNCTION OF REPRODUCING OPTICAL INFORMATION

BACKGROUND OF THE INVENTION

The present invention relates to an optical information recording and reproducing system using a semiconductor laser as a light source for recording and/or reproducing information on the information recording medium.

There have been used, as a semiconductor laser source with less noises inherent to the optical feedback, a semiconductor laser with the superimposition of a high-frequency current of 500–1000 MHz and a semiconductor laser (a laser diode with independent pulsating emission) which operates at 1 GHz or higher on a direct current basis. In order to further reduce noises inherent to the optical feedback, the overall system using the semiconductor laser must be constructed suitably. It is known that a system using a semiconductor laser with the superimposition of a high-frequency current has its noise level increasing or decreasing depending on the high-frequency current superimposed and the arrangement of the optical system (JP-A-59-210541, JP-A-60-101735). In contrast, it is not yet clear how to construct the system suitably for reducing the optical feedback noise in the case of the laser diode with independent pulsating emission.

SUMMARY OF THE INVENTION

An object of the present invention is to provide a structure of an optical information recording-reproducing system using a laser diode with independent pulsating emission as a light source, with the intension of operating the system in a state of sufficiently low noise.

FIG. 1 is a brief diagram showing, as an example, the optical information recording-reproducing system according to the present invention. Indicated by 21 is a semiconductor laser source, and 24 is a disc with an information recording medium being provided thereon. The medium is provided on a disc-shape substrate, for example, and information is recorded in the form of roughness or as the variation in the reflectivity. Indicated by 22 is a lens for collimating the light beam from the semiconductor laser, and 25 is a lens for focusing the laser beam on the surface of the disc 24 to form a spot of certain diameter. In this system, the laser beam emitted by the laser diode with independent pulsating emission 21 is projected onto the information recording medium on the disc 24 by means of the lenses 22 and 25, and, after being modulated by recorded information, the beam is reflected. The modulated reflection beam returns on the same light path, and it is detected by a photo-sensor through a half mirror (or beam splitter) 23 disposed midway between the semiconductor laser 21 and the disk 24. Indicated by 26 is a lens for converging the reflected beam onto the photo-sensor.

Shown in FIG. 1 is a fundamental arrangement of the optical information recording-reproducing system, and other subordinate components may be added to the system, to which the principle of the present invention is equally applicable.

In this specification, the laser diode with independent pulsating emission generally includes the following semiconductor laser. Generally, a semiconductor laser produces a constant light output when driven by a d.c. current. In contrast, a self-oscillation semiconductor laser produces pulsative light at a laser inherent frequency ranging from several hundred MHz to several GHz even by being driven by a d.c. current. Such a self-oscillation semiconductor laser is known to be realized by the following methods. One method is to form an unexcited saturable absorbing region in part of the resonator, and another method is to use abreast the variation of refractive index and the variation of current density for the confinement of light on the laser lateral direction. The former method is carried out by the structure as shown in FIG. 2. In part of an n-type GaAs substrate 1, a recessed stripe 11 is formed, on which are formed an n-type $Al_xGa_{1-x}As$ clad layer 2, an $Al_yGa_{y-1}As$ active layer 3, a p—$Al_xGa_{1-x}As$ clad layer 4, and a p+-GaAs cap layer 5 in this order. Over the p+-GaAs cap layer of "the CSP structure laser", electrodes 6 and 7 are formed. The electrodes 6 and 7 have their intermediate sections removed for a width of 5–50 μm. An electrode 8 is formed on the entire surface of the rear side n-GaAs layer. In consequence, the active layer beneath the region where the electrodes are absent becomes a weak excited state, serving as a saturable absorbing region, which induces the self oscillation.

The latter method is briefed in the following. The lateral flare-out of the light in the active region is confined in the form of stripe (refractivity waveguide) by utilizing the difference of reflection, and at the same time the current is confined to the form of stripe in proximity to the active region (gain waveguide). Specific structures are shown in FIGS. 3 and 4. In the example of FIG. 3, an n-GaAs layer 10 which will become a current confinement layer is grown on a p-GaAs substrate 9, and a groove 11 is formed in the layer to reach the p-GaAs substrate. A p—$Al_yGa_{1-y}As$ clad layer 4, an $Al_yGa_{y-1}As$ active layer 3, an n—$Al_xGa_{1-x}As$ clad layer 2, and an n-GaAs layer 9 are grown over the layer 10. Finally, electrodes 8 and 12 are formed on the p-GaAs substrate side and n-GaAs cap layer side, respectively. In the example of FIG. 4, a p—$Al_xGa_{1-x}As$ clad layer 2, an $Al_yGa_{1-y}As$ active layer 3, a p—$Al_xGa_{1-x}As$ clad layer 4, and a p-GaAs cap layer are grown on an n-GaAs substrate 1. An $SiO_2$ stripe is provided on the p-GaAs cap layer, the p—$Al_xGa_{1-x}As$ and p-GaAs layers are etched off to form a protrusion 12, and an n-GaAs current confinement layer 9 is grown selectively around the stripe. The $SiO_2$ mask is removed, and a p—$Al_xGa_{1-x}As$ layer 4 and p+-GaAs cap layer 5 are grown over the entire surface. Finally, electrodes 7 and 6 are formed on the n-GaAs substrate side and p+-GaAs cap layer side, respectively.

Both structures shown in FIGS. 3 and 4 have their n-GaAs current confinement layer serving as a light absorbing region, and the light is confined in the form of stripe beneath the stripe where the n-GaAs layer is absent (refractivity waveguide). In addition, the current is also confined by the n-GaAs layer to the stripe region where the n-GaAs layer is absent (gain waveguide). In consequence, the refractivity waveguide and gain waveguide coexist, resulting in the self oscillation. Shown in FIGS. 2–4 are the typicals of the laser diodes with independent pulsating emission, and there are of course numerous variants.

For the optical information recording-reproducing system using the light source of the above-mentioned laser diodes with independent pulsating emission, the examination was conducted for evaluating the relation between the laser pulse period T (seconds) and the noise and the relation between the light path length L (m)

between the laser source and information recording medium and the noise, and it revealed that the noise increases and decreases periodically in response to the variation in L and T.

Using these relations, with T and L being set as follows, the objective of the present invention, i.e., the reduction of noise level in the optical information recording-reproducing system can be achieved.

$$(n-1) \times 0.8 \times c/2L < 1/T < n \times 0.7 \times c/2L \quad (1)$$

where c is the light velocity, and n is a natural number.

FIG. 5 depicts the above relations, in which hatched portions are regions where the noise is prominent and intermediate portions with the description of n=1, n=2, etc. are regions which meet the equation (1).

The most desirable regions, in which the noise is minimized, are given by the following inequality.

$$(n-1) \times 0.85 \times c/2L < 1/T < n \times 0.6 \times c/2L \quad (2)$$

where c is the light velocity, and n=1, 2, 3. These regions are most practical for industrial production. This condition is depicted in FIG. 6, where the noise is prominent in the hatched portions as in FIG. 5.

The semiconductor laser, in many cases, has oscillation frequencies in the range of 100 MHz $\leq 1/T \leq$ 6 GHz, or more practically in the range of 300 MHz $\leq 1/T \leq$ 6 GHz. The light path length L (m) between the semiconductor laser and information recording medium is dependent on the system, and it ranges from 2 cm to 30 cm in many cases.

DESCRIPTION OF THE PREFERRED EMBODIMENTS

Figure 1:
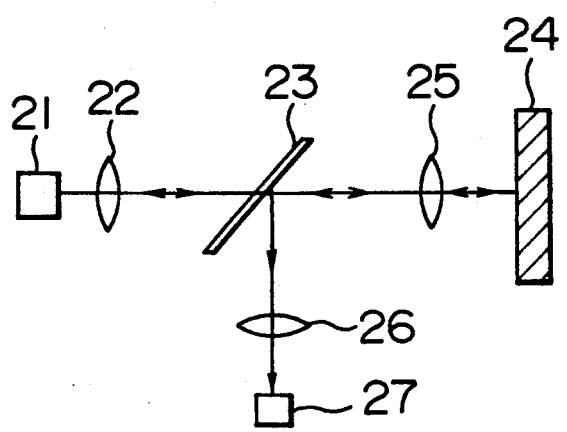
FIG. 1 is a perspective diagram showing the fundamental arrangement of the optical system of the inventive optical information reproducing system.
Figure 2:
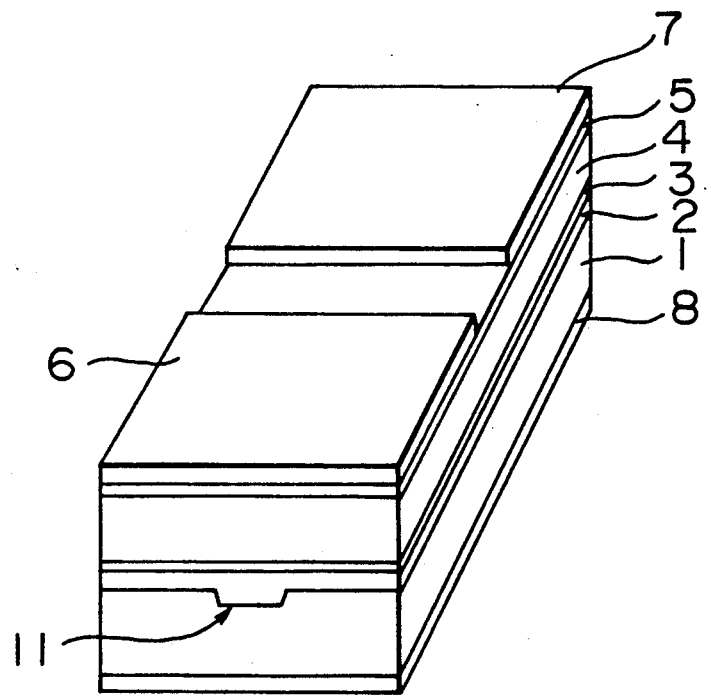
FIG. 2 is a perspective diagram showing an example of the laser diode with independent pulsating emission.
Figure 3:
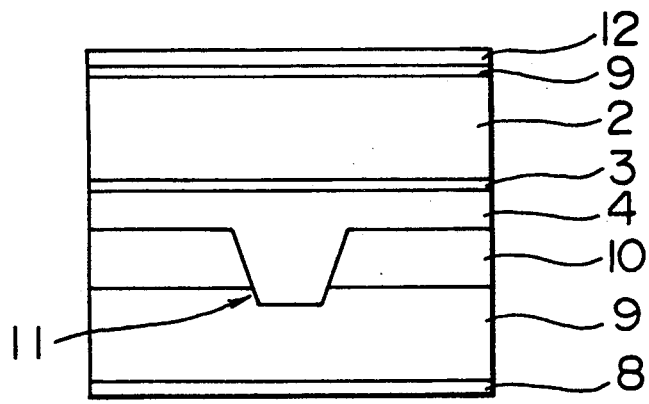
FIGS. 3 and 4 are cross-sectional diagrams of other examples of the laser diode with independent pulsating emission.
Figure 4:
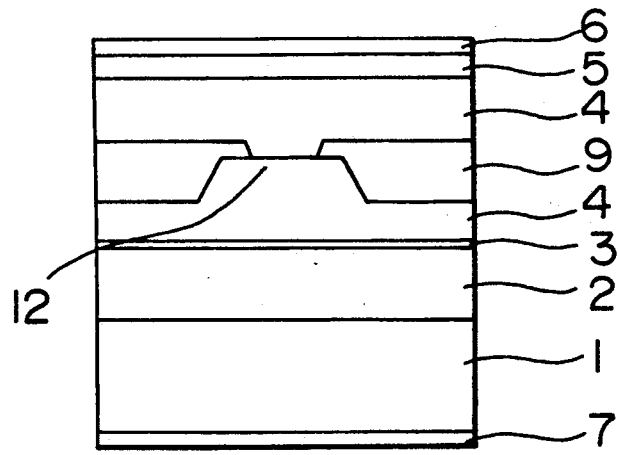

FIG. 1 shows the arrangement of the optical system of the information reproducing system used in the present embodiment. The optical system is identical to that described previously. A laser diode with independent pulsating emission 1 operates on a direct current basis to provide a pulsative emission of light, which is collimated by a lens 2, passed through a half mirror 3, and focused by a lens 2' on an optical disk 4. A light beam reflected by the optical disk 4 is passed through the half mirror 3 and lens 2", and focused on a photo-sensor 5, by which the light is converted into an information signal. Part of the light reflected on the optical disk 4 goes through the half mirror 3 and returns to the semiconductor laser 1. The amount of this optical feedback differs depending on the aperture diameter of the lens, reflectivity of the optical disk 4 and the beam splitting ratio of the half mirror 3, and it ranges 0.1-10%. In the present embodiment, the lens aperture diameter (NA) is 0.45, the optical disk reflectivity is 50%, the half mirror beam splitting ratio is 1:1, the optical feedback is 2%, and the light path length between the semiconductor laser 1 and optical disk 4 is 60 mm.

Figure 7:
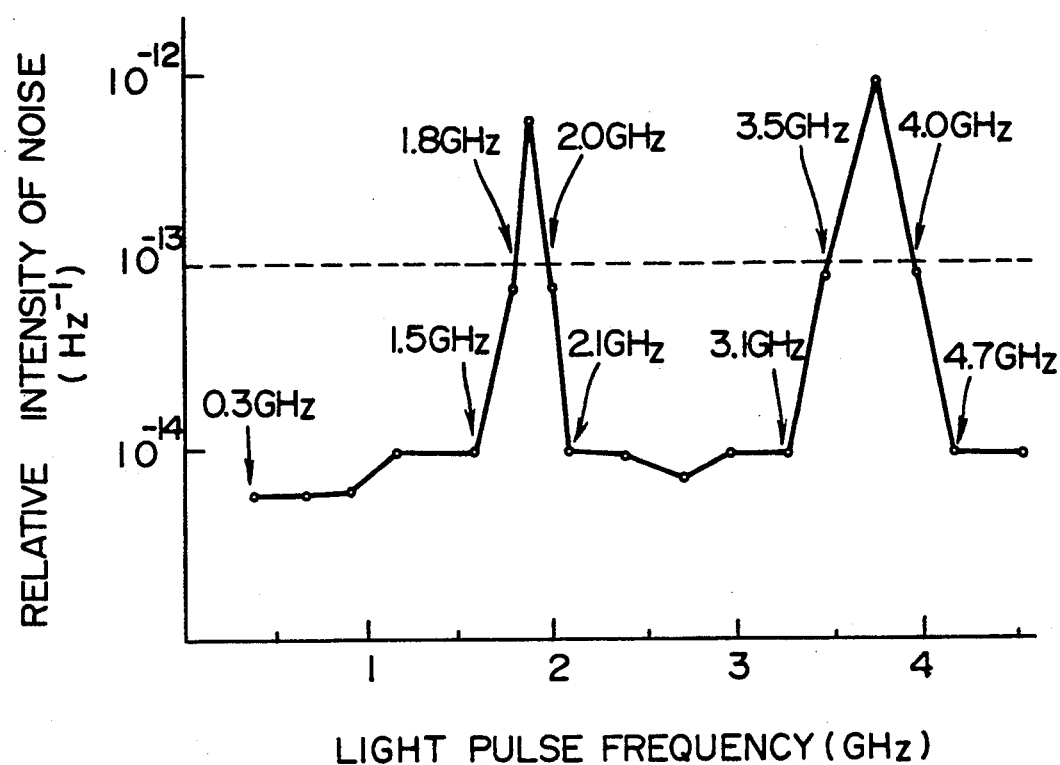
FIGS. 7 and 8 are diagrams showing the dependency of the relative noise intensity on the pulsation frequency.

FIG. 7 shows the relation between the noise (relative noise intensity) and the pulsation frequency in this system arrangement. The diagram indicates that the system of the present embodiment accomplishes the noise reduction at pulsation frequencies below 1.8 GHz, between 2.0–3.5 GHz, and above 4.0 GHz. A relative noise intensity of $10^{-13}$ Hz$^{-1}$ is such a level that a pronounced noise of a semiconductor laser is recognized in the optical information recording-reproducing system. Application of the present invention eliminates noises of such intensity.

Figure 5:
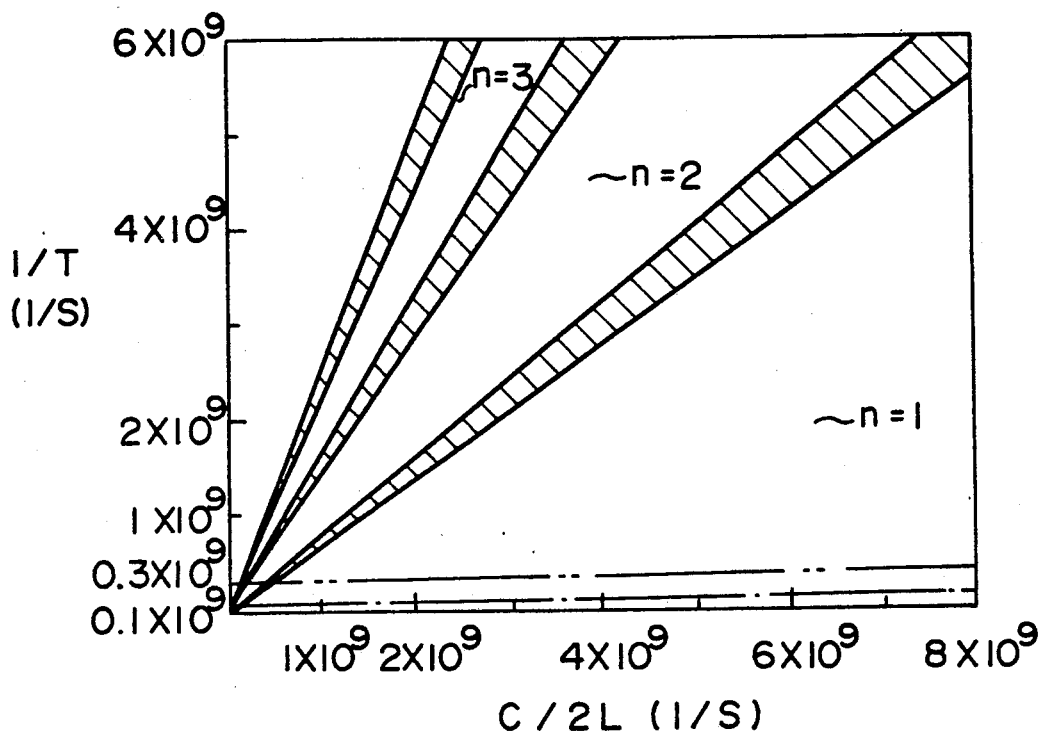
FIG. 5 is a diagram showing the region of low noise in the relation between the light path length L between the semiconductor laser and recording medium and the laser pulse period T.
Figure 6:
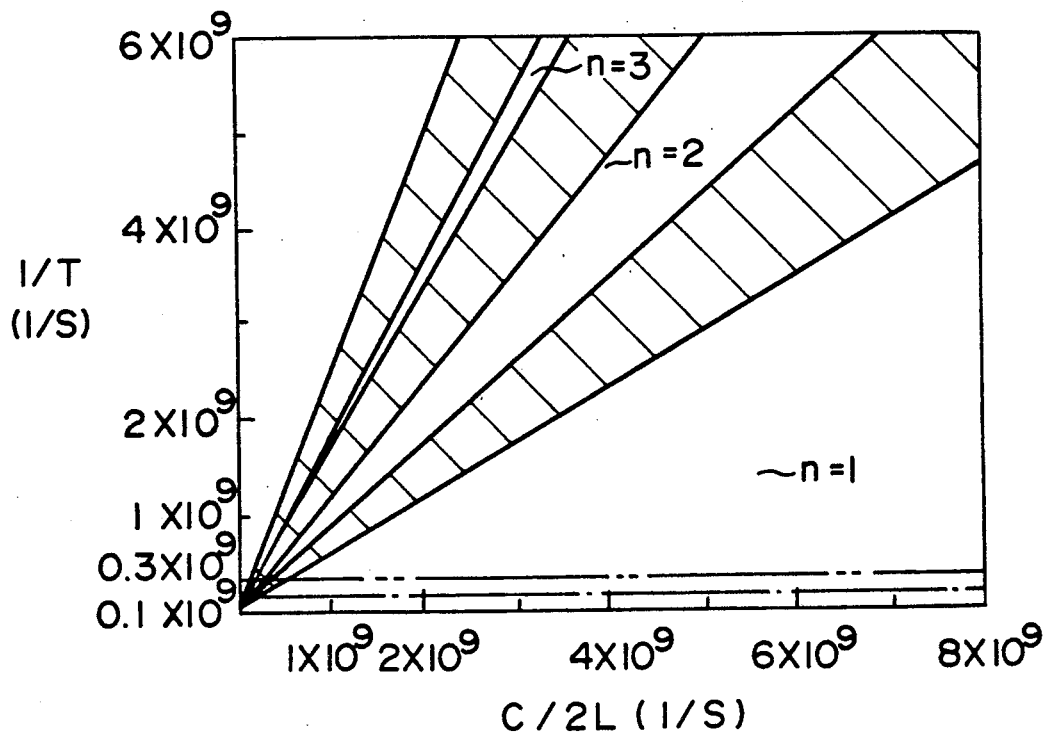
FIG. 6 is a diagram showing the relation between the noise and pulsation frequency (laser pulse frequency), demonstrating the noise reduction effect according to the present invention.

Although the light path length is set to 60 mm in the present embodiment, there exist distinct pulsation frequency regions effective for the noise reduction for different light path lengths. From the measurement results of FIG. 7 for the variable light path length, low noise regions with relative noise intensities below $10^{-13}$ Hz$^{-1}$ are drawn as shown in FIG. 5. The vertical axis of FIG. 5 represents the reciprocal of the laser pulse period T, i.e., the pulsation frequency, while the horizontal axis represents the time expended by the light with a velocity of c m/sec to go and back along the light path length L m between the semiconductor laser 1 and optical disk 4. The figure separates high-noise regions (hatched portions) from low-noise regions, the latter being expressed by the following inequality.

$$(n-1) \times 0.8 \times c/2L < 1/T < n \times 0.7c/2L$$

where n is a natural number.

(The regions shown in FIG. 5 are the cases of n=1, 2 and 3, exhibiting the periodicity of noise variation, and similar low-noise regions exist for the values of n greater than 3.) Accordingly, by application of the relation revealed by the present invention to the light path length L and laser pulse period T, a low-noise optical information reproducing system can be realized.

Figure 8:
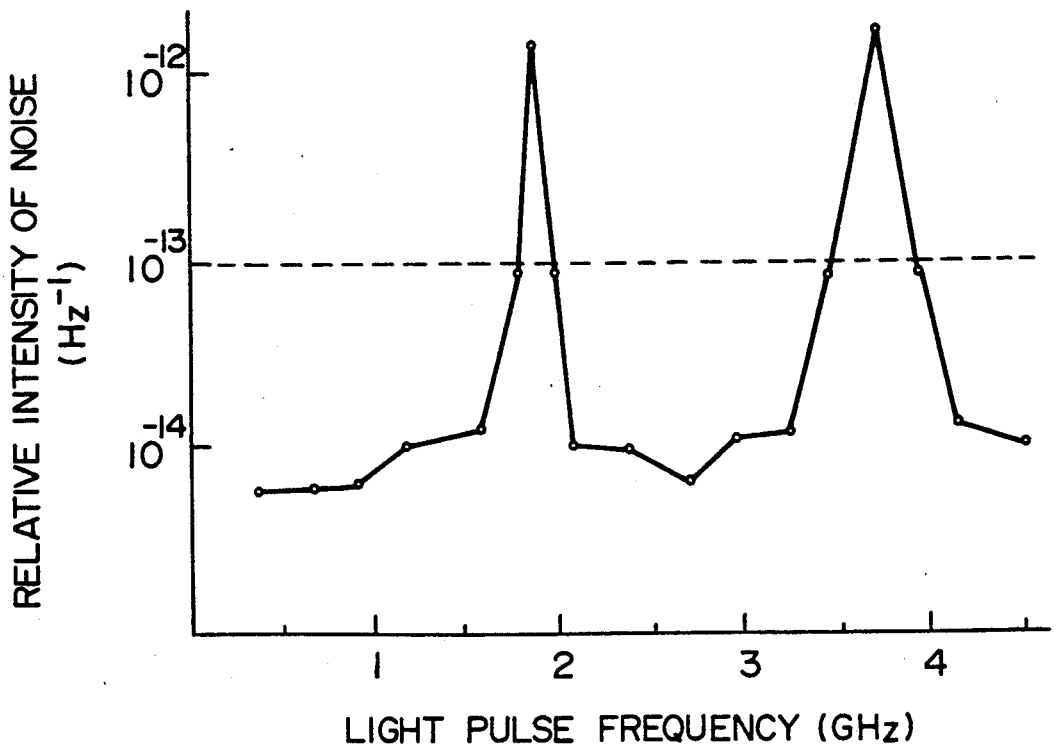

For the amount of optical feedback increased to 5%, the pulsation frequency at which the noise begins to increase stays virtually unchanged. FIG. 8 shows the measurement result of this case. The difference resides only in the increased maximum value of noise as compared with the case of 2% optical feedback.

The increase in noise shown in FIG. 7 is prominent in a 0.5–5% region of optical feedback, and, by using the relation of L and T revealed by the present invention, the noise can be reduced by 10–25 dB.

Besides the optical system illustrated by the foregoing embodiment, the present invention is also applicable to optical information reproducing systems in general using the laser diode with independent pulsating emission which behaves pulsative oscillation when operated on a direct current basis, in which case the readout signal has its noise level improved by 10–25 dB.

What is claimed is:

1. A system having a function of recording and/or reproducing optical information comprising:

a semiconductor laser with independent pulsating emission for generating laser pulses;

a disc for holding an optical information recording medium receiving and reflecting said laser pulses generated from said semiconductor laser, said medium modulating said laser pulses in accordance with the information recorded in said medium; and a photo-sensor for detecting the modulated laser pulses reflected from said medium, wherein the arrangement of said semiconductor laser and said disc is set to meet an inequality $(n-1)\times 0.8\times C/2L < 1/T < n\times 0.7C/2L$ to maintain relative noise intensities below $10^{-13}\,\mathrm{Hz}^{-1}$ for the system:

where T is a time period (seconds) of said laser pulses generated from said semiconductor laser, L is a light path length (meters) between said semiconductor laser and said medium, C is the velocity of light, and n is a natural number.

* * * * *